(12) United States Patent
Wang et al.

(10) Patent No.: US 10,451,879 B2
(45) Date of Patent: Oct. 22, 2019

(54) DISPLAY DEVICE AND METHOD OF CONTROLLING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Chenru Wang, Beijing (CN); Xue Dong, Beijing (CN); Dong Chen, Beijing (CN); Haiwei Sun, Beijing (CN); Ruijun Dong, Beijing (CN); Lili Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/544,776

(22) PCT Filed: Jan. 23, 2017

(86) PCT No.: PCT/CN2017/072173
§ 371 (c)(1),
(2) Date: Jul. 19, 2017

(87) PCT Pub. No.: WO2017/219672
PCT Pub. Date: Dec. 28, 2017

(65) Prior Publication Data
US 2018/0217378 A1 Aug. 2, 2018

(30) Foreign Application Priority Data
Jun. 22, 2016 (CN) .......................... 2016 1 0460717

(51) Int. Cl.
*G02B 27/01* (2006.01)
*G02B 26/02* (2006.01)
(Continued)

(52) U.S. Cl.
CPC .......... *G02B 27/0172* (2013.01); *G02B 3/14* (2013.01); *G02B 26/005* (2013.01); *G02B 26/02* (2013.01);
(Continued)

(58) Field of Classification Search
CPC .. G02B 27/0172; G02B 3/14; G02B 27/3232; G02B 26/02; G02B 26/005;
(Continued)

(56) References Cited

U.S. PATENT DOCUMENTS

2013/0234935 A1\* 9/2013 Griffith ................ G02B 26/004
345/156

FOREIGN PATENT DOCUMENTS

CN 10554392 A 5/2016
CN 105607260 A 5/2016
(Continued)

OTHER PUBLICATIONS

Second Chinese Office Action, for Chinese Patent Application No. 201610460717.3, dated Sep. 13, 2017, 11 pages.
(Continued)

*Primary Examiner* — Nathanael R Briggs
*Assistant Examiner* — William D Peterson
(74) *Attorney, Agent, or Firm* — Kinney & Lange, P.A.

(57) ABSTRACT

A display device and a method of controlling the same realizes a virtual reality display and an augmented reality display. The display device includes a transparent display panel, an imaging device disposed at a light-exiting side of the transparent display panel, and a light adjusting cover disposed at a side of the transparent display panel away from
(Continued)

the light-exiting side. The transparent display panel is disposed within a focal length of the imaging device. The imaging device is configured to image pictures displayed on the transparent display panel at a side thereof away from the imaging device. The light adjusting cover is switchable between a light-transmitting state and a light-shaded state, and is capable of covering a viewing field of human eyes. The display device can perform the virtual reality display or the augmented reality display.

14 Claims, 4 Drawing Sheets (51) Int. Cl.
*G02F 1/1335* (2006.01)
*G02F 1/137* (2006.01)
*G02F 1/29* (2006.01)
*H01L 27/32* (2006.01)
*H01L 51/52* (2006.01)
*G02F 1/13* (2006.01)
*G02B 3/14* (2006.01)
*G02B 26/00* (2006.01)

(52) U.S. Cl.
CPC ............... *G02F 1/13* (2013.01); *G02F 1/137* (2013.01); *G02F 1/133528* (2013.01); *G02F 1/29* (2013.01); *H01L 27/3232* (2013.01); *H01L 51/5275* (2013.01); *G02B 2027/0178* (2013.01); *G02B 2207/115* (2013.01); *G02F 2001/133531* (2013.01); *G02F 2001/294* (2013.01); *H01L 51/524* (2013.01); *H01L 51/5281* (2013.01)

(58) Field of Classification Search
CPC ...... G02B 2027/0178; G02B 2207/115; G02F 2001/294; G02F 2001/133531; G02F 1/133528; G02F 1/137; G02F 1/29; G02F 1/13; H01L 51/5275; H01L 51/524; H01L 51/5281; H01L 27/3232
USPC .......................................................... 349/33
See application file for complete search history.

(56) References Cited

FOREIGN PATENT DOCUMENTS

CN          205246971 U     5/2016
CN          105866956 A     8/2016

OTHER PUBLICATIONS

International Search Report and Written Opinion dated Apr. 21, 2017, for corresponding PCT Application No. PCT/CN2017/072173.
First Chinese Office Action dated Apr. 17, 2017, for corresponding Chinese Application No. 201610460717.3.

* cited by examiner

Fig. 4 controlling the light adjusting cover to be in the light-shaded state and adjusting the focal length of the imaging device to perform the virtual reality display ⸺S100 controlling the light adjusting cover to be in the light-transmitting state and adjusting the focal length of the imaging device to perform the augmented reality display ⸺S101

DISPLAY DEVICE AND METHOD OF CONTROLLING THE SAME

CROSS-REFERENCE TO RELATED APPLICATION

This application is a national phase application from PCT/CN2017/072173 field on Jan. 23, 2017 and claims the benefit of Chinese Patent Application No. CN201610460717.3, titled "Display Device and Method of Manufacturing the same" and filed on Jun. 22, 2016 in the State Intellectual Property Office of China, the whole disclosure of which is incorporated herein by reference.

BACKGROUND OF THE INVENTION

Field of the Invention

Embodiments of the disclosure relate to the field of display technique, and particularly to a display device and a method of controlling the same.

Description of the Related Art

With the development of the display technique, more and more different types of display devices appear in people's life. A virtual reality (referred as VR) display device and an augmented reality (referred as AR) display device have been widely concerned due to their continent wearing and high practicability and other advantages.

The virtual reality refers to generating a three-dimensional virtual world through computer simulation to provide simulation on the sense such as the vision, hearing or feeling to a user to allow the user to be personally on the scene. The augmented reality is a technique to integrate the real word information and the virtual world information, and to simulate the entity information such as vision information, sound, taste and feeling difficult to be experienced in a predetermined time and space range in the reality world and then superimposed the information through science and technology such as the computer to apply the virtual information to the real world to be sensed by human perception, thereby realizing an extra mundane sensual experience.

However, the current virtual reality display device and augmented reality display device involve respective different requirements in terms of enclosed environment and imaging position, which causes the virtual reality display and the augmented reality display to be not compatible with each other, thus the user's requirements cannot be satisfied, thereby reducing the user experience.

SUMMARY OF THE INVENTION

Embodiments of the disclosure provide a display device and a method of controlling the same which realizes a virtual reality display and an augmented reality display.

According to an aspect of the disclosure, there is provided a display device comprises a transparent display panel, an imaging device disposed at a light-exiting side of the transparent display panel, and a light adjusting cover disposed at a side of the transparent display panel opposite to the light-exiting side. The transparent display panel is disposed such that a distance between the transparent display panel and the imaging device is less than or equal to a focal length of the imaging device. The imaging device is configured to image pictures displayed on the transparent display panel at a side thereof away from the imaging device. The light adjusting cover is configured to be switchable between a light-transmitting state and a light-shaded state, and is capable of covering view field of human eyes.

Alternatively, the imaging device comprises a liquid lens. The liquid lens comprises a transparent housing and a conductive aqueous solution and an insulation solution packaged in the transparent housing. The transparent housing on an inner wall thereof is provided with a hydrophobic layer not completely covering the transparent housing. The conductive aqueous solution and the insulation solution have different refractive indexes and are soluble in with each other.

Alternatively, the imaging device comprises a liquid crystal lens.

Alternatively, the imaging device comprises a lens group.

Alternatively, the light adjusting cover comprises a curved-surface type light adjusting cover.

Alternatively, the light adjusting cover comprises a liquid crystal light adjusting cover to control the light adjusting cover to switch between the light-transmitting state and the light-shaded state by controlling orientations of liquid crystal molecules.

Further alternatively, the liquid crystal light adjusting cover comprises a first substrate, a second substrate, a liquid crystal layer disposed between the first substrate and the second substrate, an upper polarizer disposed on a side of the first substrate away from the liquid crystal layer, and a lower polarizer disposed on a side of the second substrate away from the liquid crystal layer. The upper polarizer has a polarization direction perpendicular to a polarization direction of the lower polarizer.

Alternatively, the light adjusting cover comprises a movable shutter plate. The movable shutter plate is configured to be movable so that the light adjusting cover is in the light-transmitting state or the light-shaded state.

Alternatively, the transparent display panel comprises an organic light-emitting diode display panel.

Alternatively, the display device further comprises a controller for controlling the light adjusting cover into the light-transmitting state or the light-shaded state and/or controlling the focal length of the imaging device.

Alternatively, the display device comprises a wearable glasses or wearable helmet.

Alternatively, a first electrode is provided on an inner wall of the transparent housing, a second electrode is provided in contact with the conductive aqueous solution, on a bottom surface of the transparent housing, and an insulation layer is disposed between the first electrode and the hydrophobic layer such that the conductive aqueous solution, the first electrode and the insulation layer constitute a capacitor such that a radian of interface between the conductive aqueous solution 40 and the insulation solution is changed when a voltage is applied between the conductive aqueous solution and the first electrode, which finally results in change of the focal length of the liquid lens.

According to another aspect of the disclosure, there is provided a method for controlling the display device as described above, comprising: controlling the light adjusting cover into the light-shaded state and adjusting the focal length of the imaging device to perform a virtual reality display; and controlling the light adjusting cover into the light-transmitting state and adjusting the focal length of the imaging device to perform an augmented reality display.

Alternatively, adjusting the focal length of the imaging device to perform a virtual reality display comprises: adjusting the focal length $f_1$ of the imaging device so that $f_1 = L \times d \times \tan \alpha / [r + (d-L) \times \tan \alpha]$, wherein $\alpha$ is an included angle between a line connecting a top end of the image imaged during the virtual reality display and the human eyes and a primary optical axis of the imaging device, d is a distance between the imaging device and the human eyes, r is a distance between a top end of the transparent display panel and the primary optical axis of the imaging device, and L is a distance between the transparent display panel and the imaging device.

Further alternatively, adjusting the focal length $f_1$ of the imaging device so that $f_1 = L \times d \times \tan \alpha / [r + (d-L) \times \tan \alpha]$ comprises: adjusting the focal length $f_1$ of the imaging device so that $f_1 = L \times d \times \tan \beta / [r + (d-L) \times \tan \beta]$, wherein $\beta$ is an included angle between a line connecting a top end of the image just covering the view field of the human eyes and the human eyes and the primary optical axis of the imaging device 20.

Alternatively, adjusting the focal length of the imaging device to perform the augmented reality display comprises adjusting the focal length $f_2$ of the imaging device so that $f_2 = L \times d \times \tan \gamma / [r + (d-L) \times \tan \gamma]$, wherein $\gamma$ is an included angle between a line connecting a top end of the image imaged during the augmented reality display and the human eyes and the primary optical axis of the imaging device, and $\gamma < \beta$.

BRIEF DESCRIPTION OF THE DRAWINGS

In order to clearly describe the technical solution of embodiments of the disclosure or in prior art, the accompanying drawings necessary for describing the embodiments or the prior arts are simply illustrated below. Obviously, the accompanying drawings described below are merely some embodiments of the disclosure, and those skilled in the art may arrive at other accompanying drawings based on these drawings without any inventive steps.

FIG. 2(*a*) is a first schematic structural view of a liquid lens according to an exemplary embodiment of the disclosure;

FIG. 2(*b*) is a second schematic structural view of the liquid lens according to an exemplary embodiment of the disclosure;

FIG. 6(*a*) is a schematic structural view of a display device performing a virtual reality display according to an exemplary embodiment of the disclosure; and FIG. 6(*b*) is a schematic structural view of a display device performing a augmented reality display according to an exemplary embodiment of the disclosure.

DETAILED DESCRIPTION OF PREFERRED EMBODIMENTS OF THE INVENTION

The technical solution of the disclosure will be fully and clearly described with reference to the accompanying drawings in embodiments thereof. The embodiments as described are obviously merely a part of embodiments of the disclosure, rather than all embodiments thereof. All other embodiments obtained by those ordinary skilled in the art without any inventive step based on the embodiments of the disclosure will fall within the scope of the disclosure.

Figure 1:
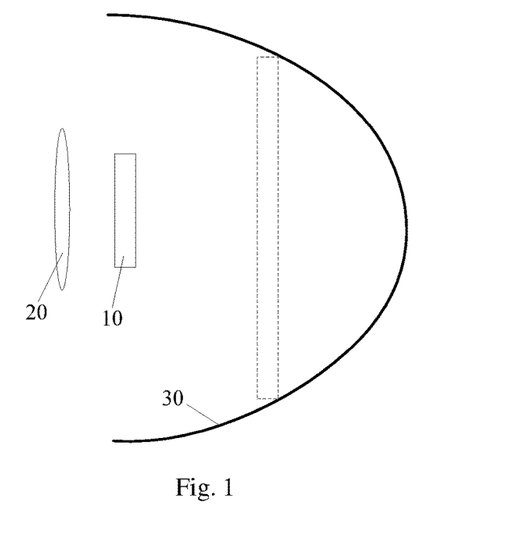
FIG. 1 is a schematic structural view of a display device according to an exemplary embodiment of the disclosure.

Embodiments of the disclosure provide a display device. As shown in FIG. 1, the display device comprises a transparent display panel 10, an imaging device 20 disposed at a light-exiting side of the transparent display panel 10, and a light adjusting cover 30 disposed at a side of the transparent display panel 10 away from the light-exiting side. The transparent display panel 10 is disposed within a focal length of the imaging device 20. The imaging device 20 is configured to image pictures, displayed on the transparent display panel 10, at a side of the transparent display panel 10 away from the imaging device 20 (as shown by the dashed block in FIG. 1). The light adjusting cover 30 is configured to switch between a light-transmitting state and a light-shaded state, and is capable of covering viewing field of human eyes.

Note that, in the embodiments of the present disclosure, the principle in which the display device performs a virtual reality display is that the imaging device 20 images the pictures displayed on the transparent display panel 10 and an image imaged by the imaging device 20 is located at the side of the transparent display panel 10 away from the imaging device 20. When the light adjusting cover 30 is in the light-shaded state, only the image, imaged by the imaging device, of the pictures displayed on the transparent display panel 10 can be viewed, and ambient cannot be viewed, thereby realizing the virtual reality display.

The principle in which the display device performs an augmented reality display is that the imaging device 20 images the pictures displayed on the transparent display panel 10 and the image imaged by the imaging device 20 is located at the side of the transparent display panel 10 away from the imaging device 20. When the light adjusting cover 30 is in the light-transmitting state, the image, not only imaged by the imaging device, of the pictures displayed on the transparent display panel 10 can be viewed but also the ambient can be viewed, thereby realizing the augmented reality display. When performing the augmented reality display, since the image of the pictures displayed on the transparent display panel 10 is needed to be compatible with the ambient, the image of the pictures displayed on the transparent display panel 10 is bigger and farther relative to the virtual reality display. FIG. 1 only schematically depicts that the image of the pictures displayed on the transparent display panel 10 is located within the light adjusting cover 30. However, the image of the pictures displayed on the transparent display panel 10 may be also located outside the light adjusting cover 30 when performing the augmented reality display.

It is noted that, the transparent display panel 10 is not limited herein as long as it is a self-luminous and transparent display panel.

It is noted that, regarding the structure of the imaging device 20, the imaging device 20 may be any suitable device to image the pictures displayed on the transparent display panel 10 at the side away from the imaging device 20, in which the focal length of the imaging device 20 is adjustable. Since the transparent display panel 10 is placed within the focal length of the imaging device 20, the image imaged by the imaging device 20 is an upright magnified virtual image.

It is noted that, switching of the light adjusting cover 30 between the light-transmitting state and the light-shaded state is not limited therein. In addition, shape and size of the light adjusting cover 30 are not limited herein, either, as long as the light adjusting cover 30 can cover the viewing field of the human eyes.

It is noted that, embodiments of the disclosure merely depict the structures of the relevant parts to illustrate the inventive idea or concept, and other structures such as structures for fixing the transparent display panel 10, the imaging device 20 and the light adjusting cover 30 are not illustrated. Further, the disclosure is not intended to limit the securing manner of the transparent display panel 10, the imaging device 20 and the light adjusting cover 30.

Embodiments of the disclosure provide a display device. When the light adjusting cover 30 is in the light-transmitting state, the focal length of the imaging device 20 is adjusted to image bigger and farther so that the image of the pictures displayed on the transparent display panel 10 is bigger and farther so as to be compatible with the ambient. In this way, a user can view not only the pictures displayed on the transparent display panel 10, but also the ambient, thereby realizing the augmented reality display. When the light adjusting cover 30 is in the light-shaded state, the focal length of the imaging device 20 is adjusted to magnify the pictures displayed on the transparent display panel 10. In this way, the user can only view the pictures displayed on the transparent display panel 10, thereby realizing the virtual reality display. In the embodiments of the disclosure, since the light adjusting cover 30 is switchable between the light-transmitting state and the light-shaded state and the focal length of the imaging device 20 is adjustable, the light adjusting cover 30 and the imaging device 20 may be adjusted as desired so that the display device can perform not only the virtual reality display but also the augmented reality display, thereby improving user experience.

Figure 2A:
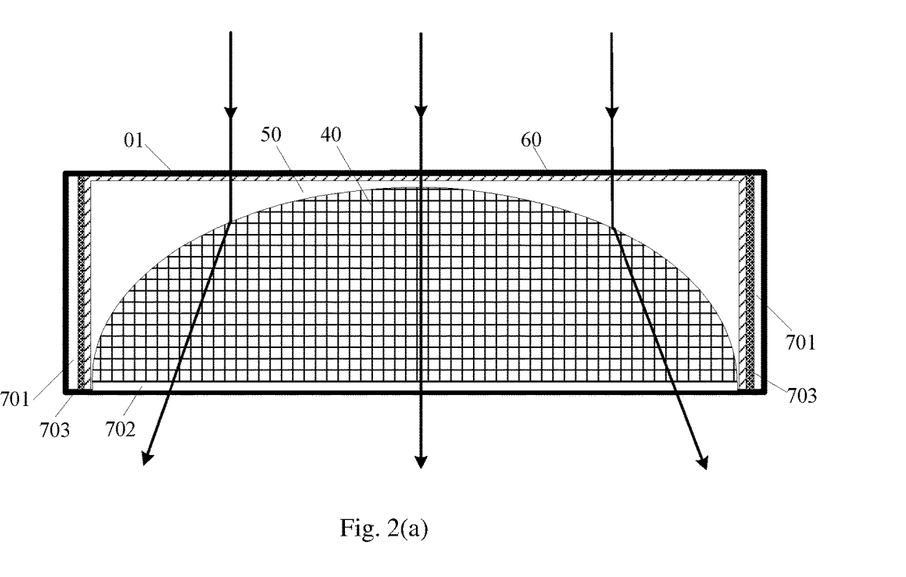
Figure 2B:
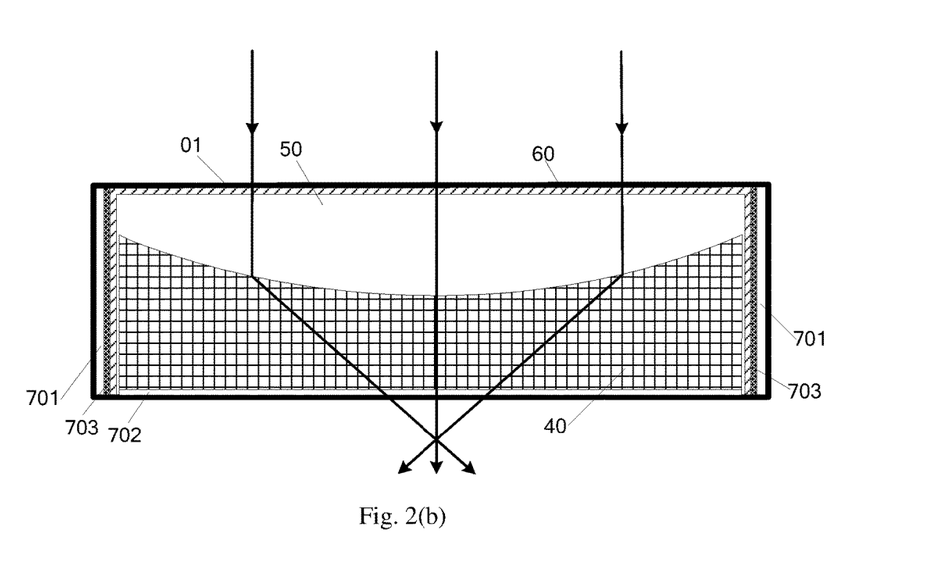

Alternatively, the imaging device 20 may be a liquid lens. As shown in FIGS. 2(a) and 2(b), the liquid lens comprises a transparent housing 01, and a conductive aqueous solution 40 and an insulation solution 50 that are packaged in the transparent housing 01. A hydrophobic layer 60 is provided on an inner wall of the transparent housing 01, which does not completely cover the transparent housing 01. The conductive aqueous solution 40 and the insulation solution 50 have different refractive indexes and are not soluble in each other.

In the present embodiment, the conductive aqueous solution 40 and the insulation solution 50 of the liquid lens are not limited herein. The conductive aqueous solution 40 may for example be water, ethanol and the like, and the insulation solution 50 may be oil. In the present embodiment, the insulation solution 50 and the conductive aqueous solution 40 are packaged within the transparent housing 01, and the insulation solution 50 functions as a filling material.

Since the conductive aqueous solution 40 is subject to gravity, in the present embodiment, preferably, a bottom surface of the inner wall of the transparent housing 01 is not provided with the hydrophobic layer 60 in order to control hydrophobic capacity of the hydrophobic layer 60 by a voltage to change a shape of the conductive aqueous solution 40, thereby adjusting a focal length of the liquid lens.

In the present embodiment, the conductive aqueous solution 40 and the insulation solution 50 are packaged within the transparent housing 01 and the transparent housing 01 is not completely covered, which may cause the conductive aqueous solution 40 to be formed into a hemispherical shape at a region where the hydrophobic layer 60 is not located in virtue of the action of a surface tension. By changing magnitude of the voltage, the hydrophobic capacity of the hydrophobic layer 60 will be changed to result in change of the surface tension of the conductive aqueous solution 40, which in turn changes the focal length of the liquid lens.

Based on the above content, a process of changing the magnitude of the voltage to change the hydrophobic capacity of the hydrophobic layer 60 will be described in detail below. As shown in FIGS. 2(a) and 2(b), for example, a first electrode 701 may be provided on the inner wall of the transparent housing 01, a second electrode 702 may be provided, in contact with the conductive aqueous solution 40, on a bottom surface of the transparent housing 01, and an insulation layer 703 is disposed between the first electrode 701 and the hydrophobic layer 60. The conductive aqueous solution 40, the first electrode 701 and the insulation layer 703 constitute one capacitor and a voltage may be applied between the conductive aqueous solution 40 and the first electrode 701. If the voltage applied to the capacitor is increased, electricity quantity of electrode plates at both sides of the capacitor will be increased, which results in increased chargers accumulated at both sides of the insulation layer 703, thereby increasing a contact area of the conductive aqueous solution 40 with the hydrophobic layer 60, i.e, weakening the hydrophobic capacity of the hydrophobic layer 60. Based on this, since capacitance of the transparent housing 01 and volume of the conductive aqueous solution 40 are constant, a liquid level of the conductive aqueous solution 40 at the peripheral inner wall of the transparent housing 01 will rise, and the insulation solution 50 will fill in a space that is originally occupied by the conductive aqueous solution 40, so that a radian of interface between the conductive aqueous solution 40 and the insulation solution 50 is changed, which finally results in change of the focal length of the liquid lens. As shown in FIGS. 2(a) and 2(b), the surface tension of the conductive aqueous solution 40 is changed, i.e., the shape thereof is changed, which in turn changes the focal length of the liquid lens.

Based on the above, in the present embodiment, the focal length of the liquid lens as desired may be obtained by adjusting the magnitude of the voltage if necessary.

In the present embodiment, the focal length of the liquid lens can be changed by adjusting the voltage so that a position and a size of an image imaged by the liquid lens are suitable for the virtual reality display or the augmented reality display. Thus, in the present embodiment, it is possible to perform any adjustment of the focal length of the liquid lens without changing a distance between the liquid lens and the transparent display panel 10, thereby simplifying the structure of the display device.

Alternatively, the imaging device 20 may be a liquid crystal lens.

In the present embodiment, it is possible to adjust angles of deflection of liquid crystal molecules by adjusting a voltage so as to change a refractive index of the liquid crystal so that a focal length of the liquid lens is changed. In other words, the focal length of the liquid crystal lens may be adjusted by adjusting the voltage.

In the present embodiment, when the liquid crystal lens are operated during the virtual reality display or the augmented reality display, the angles of deflection of liquid crystal molecules may be adjusted as desired to control the refractive index of the liquid crystal to change, thereby adjusting the focal length of the liquid crystal lens, such that a position and a size of the image imaged by the liquid crystal lens are suitable for the virtual reality display or the augmented reality display. In the present embodiment, since the focal length of the liquid crystal lens may be adjusted without moving the liquid crystal lens, it is possible to simplify the structure of the display device.

Alternatively, the imaging device 20 may be a lens group comprising a plurality of lenses, in which the plurality of lenses are combined to perform a magnification imaging of the pictures displayed on the transparent display panel 10.

In addition, the number of the lenses in the lens group is not limited herein as long as the plurality of lenses that are combined can perform a magnification imaging of the pictures display on the transparent display panel 10 without degrading quality of the imaged image. Further, the disclosure is not intended to limit the manner of combining the lenses of the lens group and how the lens group moves in the display device. In the present embodiment, in order to ensure all the lenses in the lens group have the same magnification so that the images imaged by them can be combined well and ensure the quality of the image imaged by the lens group, all the lenses in the lens group should have the same focal length.

In the present embodiment, it is possible to image the pictures displayed on the transparent display panel 10 by the plurality of lens combinations in the lens group so that the lens group is suitable for the virtual reality display or the augmented reality display by adjusting the focal length of the lens group.

It should be appreciated by those skilled in the art the image, imaged by the imaging device 20, of the picture displayed on the transparent display panel finally can be viewed by the human eyes. The light adjusting cover 30 is a non-closed light-shaded cover and is capable of covering the viewing field of the human eyes. Thus, a curved-surface type light adjusting cover has a relative small volume and thus may reduce the volume of the display device relative to the other types of light adjusting covers having other shapes, such as a square light adjusting cover. Therefore, in the present embodiment, the light adjusting cover 30 alternatively is a curved-surface type light adjusting cover.

Alternatively, the light adjusting cover 30 is a liquid crystal light adjusting cover configured to control deflection of the liquid crystal molecules to change polarization direction of light transmitted there through so as to achieve switch between the light-transmitting state and the light-shaded state.

In the present embodiment, when performing the virtual reality display, the deflection of the liquid crystal molecules may be controlled so that the light adjusting cover 30 is in the light-shaded state. When performing the augmented reality display, the deflection of the liquid crystal molecules may be controlled so that the light adjusting cover 30 is in the light-transmitting state.

In an exemplary embodiment of the disclosure, the light adjusting cover 30 is a liquid crystal light adjusting cover controllable in the light-transmitting state or the light-shaded state by controlling the deflection of the liquid crystal molecules so as to control lights from the ambient to pass or not pass through the light adjusting cover 30.

Figure 3:
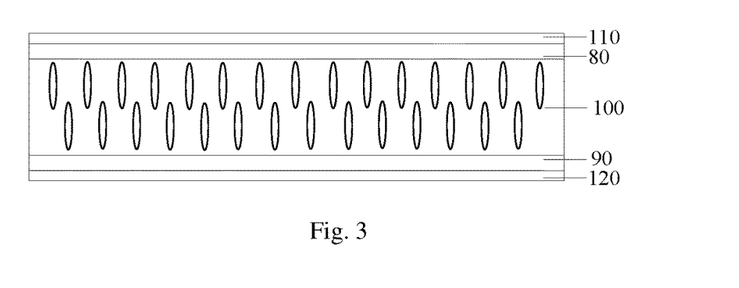
FIG. 3 is a schematic structural view of a liquid crystal light adjusting cover according to an exemplary embodiment of the disclosure.

Further, alternatively, as shown in FIG. 3, the liquid crystal light adjusting cover comprises a first substrate 80, a second substrate 90, a liquid crystal layer 100 disposed between the first substrate 80 and the second substrate 90, an upper polarizer 110 disposed on a side of the first substrate 80 away from the liquid crystal layer 100, and a lower polarizer 120 disposed on a side of the second substrate 90 away from the liquid crystal layer 100. A polarization direction of the upper polarizer 110 is perpendicular to that of the lower polarizer 120.

The principle in which the liquid crystal light adjusting cover realizes the light-transmitting state and the light-shaded state thereof is described in detail below. The polarization state of the liquid crystal molecules of the light adjusting cover is controlled by applying a voltage so that the polarization state of a liner polarization light, through the lower polarizer 120, incident to the liquid crystal layer 100 is changed by 90°. At this moment, the liner polarization light passing through the liquid crystal layer 100 may pass through the upper polarizer 110, and the liquid crystal light adjusting cover is in the light-transmitting state. When no voltage is applied to the liquid crystal light adjusting cover, the liquid crystal molecules of the liquid crystal light adjusting cover will not be deflected. Thus, the liner polarization light passing though the lower polarizer 120 will not be adjusted or affected by the liquid crystal layer 100, and will thus be blocked by upper polarizer 110 when passing through the upper polarizer 110. At this time, the liquid crystal light adjusting cover is in the light-shaded state.

According to the embodiment of the disclosure, the first substrate 80 and the second substrate 90 are not limited herein. For example, in an exemplary embodiment, the first substrate 80 may be an assembling substrate, and the second substrate 90 may be an array substrate 90. In another exemplary embodiment of the disclosure, the first substrate 80 is the array substrate, and the second substrate 90 is the assembling substrate.

Alternatively, the light adjusting cover 30 comprises a movable shutter plate which is capable of moving to allow the light adjusting cover 30 to switch between the light-transmitting state and the light-shaded state.

The movable shutter plate is opaque and, for example, may be provided with a black coating. In the present embodiment, the movable shutter plate should be capable of covering the viewing field of the human eyes. When the movable shutter plate is drawn out, the light from the ambient may enter the human eyes through the light adjusting cover 30, thus the light adjusting cover 30 is in the light-transmitting state. When the movable shutter plate is placed in the light adjusting cover, the light from the ambient is blocked by the movable shutter plate, and cannot enter the human eyes through the light adjusting cover, thus the light adjusting cover 30 is in the light-shaded state.

In an exemplary embodiment of the disclosure, the transparent display panel 10 is an organic light-emitting diode (OLED) display panel as it has high contrast, thin thickness, wide view angle and rapid response speed.

The OLED display panel comprises an anode, an organic material function layer and a cathode. Based on this, the OLED display panel further comprises an array substrate including a thin film transistor and the thin film transistor includes a source electrode, a drain electrode and an active layer. The drain electrode of the thin film transistor is electrically connected with the anode.

In the embodiments of the disclosure, when the base substrate of the transparent display panel 10 is a flexible base substrate, the transparent display panel 10 may also be a flexible display panel.

Figure 4:
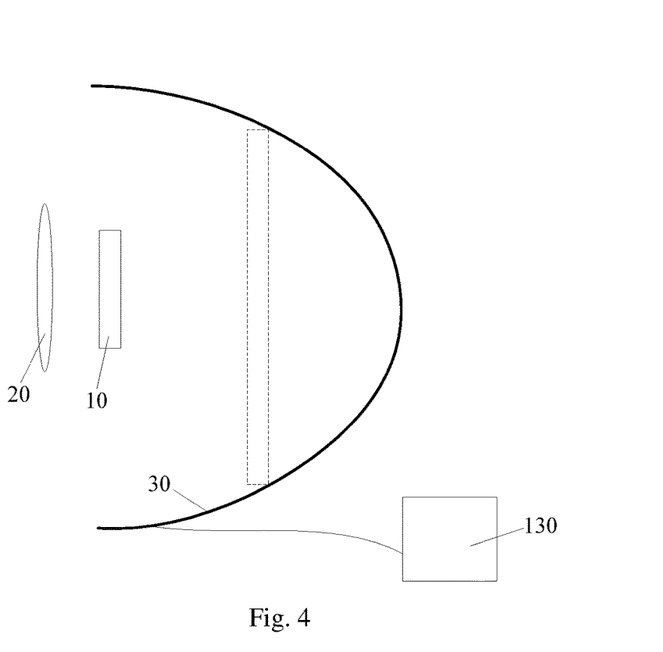
FIG. 4 is a second schematic structural view of the display device according to an exemplary embodiment of the disclosure.

Alternatively, as shown in FIG. 4, the display device may further comprises a controller 130 configured to control the light adjusting cover 30 to be in the light-transmitting state or the light-shaded state and/or control the focal length of the imaging device.

In the embodiment, the controller 130 may control the light adjusting cover 30 to be in the light-transmitting state or the light-shaded state as desired. When the display device performs the virtual reality display, the controller 130 may control the light adjusting cover 30 to be in the light-shaded state. When the display device performs the augmented reality display, the controller 130 may control the light adjusting cover 30 to be in the light-transmitting state.

Alternatively, the display device may be a wearable glasses or wearable helmet.

In the embodiment where the display device is the wearable glasses or wearable helmet, the wearable glasses or wearable helmet comprise other parts, in addition to the transparent panel 10, the imaging device 20 and the light adjusting cover 30 as described above. For example, the wearable glasses may further comprise a frame and the like.

When the display device according to the embodiments of the disclosure is the wearable glasses or wearable helmet, the wearable glasses or wearable helmet can perform not only the virtual reality display but also the augmented reality display.

Figure 5:
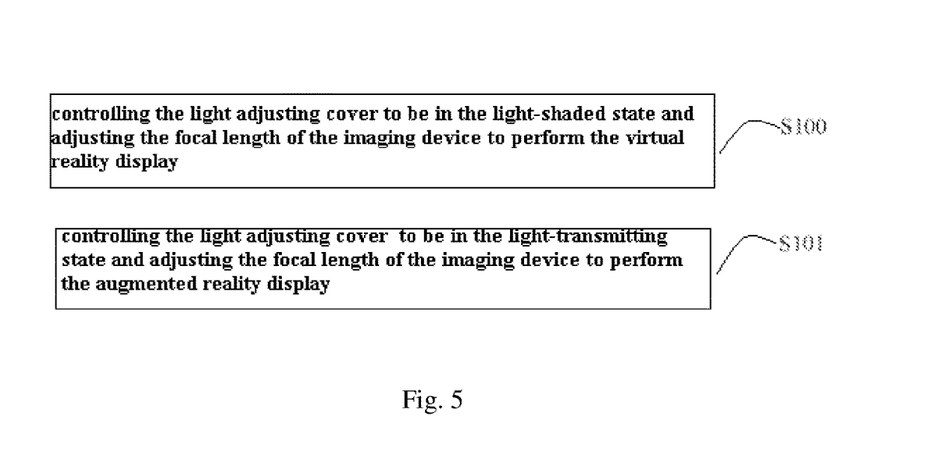
FIG. 5 is a schematic flow chart of a method of controlling a display device according to an exemplary embodiment of the disclosure.

Embodiments of the disclosure further provide a method of controlling the display device as described above, as shown in FIG. 5, the method comprising:

S100: controlling the light adjusting cover 30 to be in the light-shaded state and adjusting the focal length of the imaging device 20 to perform the virtual reality display; and S101: controlling the light adjusting cover 30 to be in the light-transmitting state and adjusting the focal length of the imaging device 20 to perform the augmented reality display.

Note that, in the embodiments of the present disclosure, regarding to structure of the imaging device 20, the structure of the imaging device 20 should be configured in such manner that the picture displayed on the transparent display panel 10 may be imaged at the side of the transparent display panel 10 away from the imaging device 20, in which the focal length of the imaging device 20 is adjustable. Since the transparent display panel 10 is placed with in a focal length of the imaging device 20, the image imaged by the imaging device 20 is an upright magnified virtual image.

In addition, in the embodiment of the present disclosure, the disclosure is not intended to limit how the light adjusting cover 30 switches between the light-transmitting state and the light-shaded state. In addition, shape and size of the light adjusting cover 30 are not limited herein, either, as long as the light adjusting cover 30 can cover the viewing field of the human eyes.

According to the method of controlling the display device according to the embodiments of the disclosure, when the light adjusting cover 30 is controlled to be in the light-transmitting state, the focal length of the imaging device 20 is adjusted such that the pictures displayed on the transparent display panel 10 are imaged bigger and farther so that the image of the picture displayed on the transparent display panel 10 is compatible with the ambient. At this moment, a user can view not only the pictures displayed on the transparent display panel 10 but also the ambient, thereby realizing the augmented reality display. When the light adjusting cover 30 is controlled to be in the light-shaded state, the focal length of the imaging device 20 is adjusted such that the pictures displayed on the transparent display panel 10 are imaged bigger. At this moment, the user can only view the pictures displayed on the transparent display panel 10, thereby realizing the virtual reality display. In the embodiments of the disclosure, since the light adjusting cover 30 is switchable between the light-transmitting state and the light-shaded state and the focal length of the imaging device 20 is adjustable, the light adjusting cover 30 and the imaging device 20 may be adjusted as desired so that the display device can perform not only the virtual reality display but also the augmented reality display, thereby improving user experience.

Figure 6A:
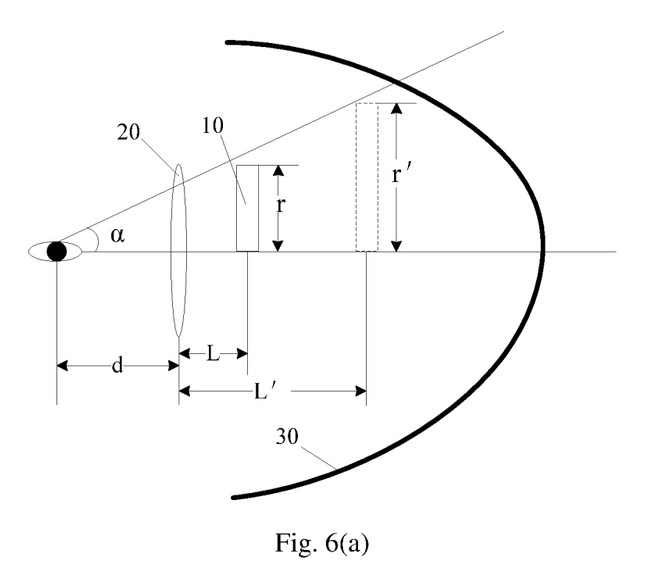

Alternatively, the step S100 may specifically include, as shown in FIG. 6(*a*), adjusting the focal length $f_1$ of the imaging device 20 so that $f_1 = L \times d \times \tan \alpha / [r + (d-L) \times \tan \alpha]$, wherein $\alpha$ is an included angle between a line connecting a top of the image imaged during the virtual reality display and the human eyes and a primary optical axis of the imaging device 20, d is a distance between the imaging device 20 and the human eyes, r is a distance between a top of the transparent display panel 10 and the primary optical axis of the imaging device 20, and L is a distance between the transparent display panel 10 and the imaging device 20.

As shown in FIG. 6(*a*), the magnification formula for the imaging device 20 is approximately $$\frac{r'}{r} = \frac{L'}{L},$$

wherein r' is a distance between the top of the picture displayed by the transparent display panel 10 and the primary optical axis of the imaging device 20, and L' is a distance between the picture displayed by the transparent display panel 10 and the imaging device 20.

In a right-angled triangle, from the formula $r' = (d+L') \times \tan \alpha$ and the above magnification formula for the imaging device 20, the following formula can be obtained:

$$L' = \frac{d \times L \times \tan\alpha}{r - L \times \tan\alpha}.$$

Further, the following formula can be obtained based on the formula of relation, between the focal length and an object distance and an image distance, of $$\frac{1}{f_1} = \frac{1}{L} + \frac{1}{L'}:$$

$$f_1 = \frac{L \times L'}{L + L'}$$
$$= L \times d \times \tan\alpha / [r + (d - L) \times \tan\alpha]$$

Based on the above, the size of the image imaged by the imaging device 20 may be adjusted by adjusting the focal length of the imaging device 20 as $f_1$. The shorter the focal length $f_1$ of the imaging device 20 is, the smaller the image imaged by the imaging device 20 is. When the image imaged by the imaging device 20 is relatively smaller, although the user may view the image imaged by the imaging device 20 and the light adjusting cover 30, the user can only view the image imaged by the imaging device 20 and thus immersed in the virtual reality display, as the light adjusting cover 30 is in the light-shaded state during the virtual reality display.

In the embodiments of the disclosure, it is possible to adjust the focal length of the imaging device 20 depending on the size of the image as desired during the virtual reality display of the display device.

Further, alternatively, adjusting the focal length $f_1$ of the imaging device 20 so that $f_1$, $L \times d \times \tan \alpha / [r + (d-L) \times \tan \alpha]$ includes: adjusting the focal length $f_1$ of the imaging device 20 so that $f_1 = L \times d \times \tan \beta / [r + (d-L) \times \tan \beta]$, wherein $\beta$ is an included angle between a line, connecting a top of the image just covering the viewing field of the human eyes and the human eyes, and the primary optical axis of the imaging device 20.

In the embodiments of the disclosure, when the focal length $f_1$ of the imaging device 20 is adjusted so that the image imaged by the imaging device 20 just covers the viewing field of the human eyes, the focal length $f_1$ for the virtual reality display is maximum, and the image imaged by the imaging device 20 is the largest one may be imaged by the imaging device during the virtual reality display. Since the human eyes merely view the image imaged by the imaging device 20 and cannot view the light adjusting cover 30 (in the light-shaded state), the user may be completely immersed in the virtual reality display, thereby improving the user practice experience.

Figure 6B:
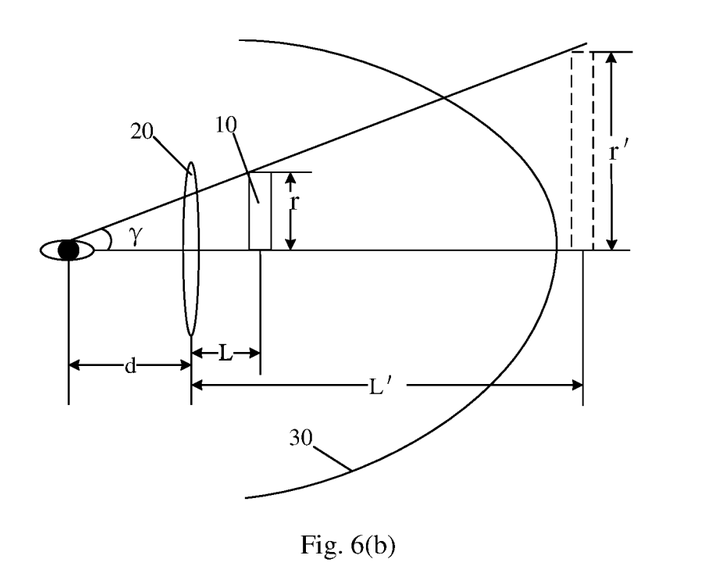

Alternatively, the step S101 specifically includes adjusting the focal length of the imaging device 20 to perform the augmented reality display, which includes adjusting the focal length $f_2$ of the imaging device 20 so that f2=L×d×tan γ/[r+(d−L)×tan γ], wherein γ is an included angle between a line, connecting a top of the image imaged during the augmented reality display to the human eyes, and the primary optical axis of the imaging device 20, and γ<β.

Similarly, the following formula can be obtained based on the formula between the focal length, the object distance and the image distance of $$\frac{1}{f_2} = \frac{1}{L} + \frac{1}{L'};$$
$$f_2 = \frac{L \times L'}{L + L'}$$
$$= L \times d \times \tan\gamma / [r + (d - L) \times \tan\gamma]$$

wherein, during the augmented reality display, since the image imaged by the imaging device 20 is larger and farther relative to the image imaged during the virtual reality display, $f_2>f_1$. Further, β is the included angle between the line, connecting the top of the image that may cover the view field of the human eyes to the human eyes, and the primary optical axis of the imaging device, and when the included angle between the line, connecting the top of the image imaged by the imaging device 20 to the human eyes, and the primary optical axis of the imaging device 20 is smaller than β, the image imaged by the imaging device 20 will be much bigger and farther. At this moment, the user may view not only the image imaged by the imaging device 20 but also the ambient since the light adjusting cover 30 is in the light-transmitting state.

In the embodiments of the disclosure, the focal length $f_2$ of the imaging device 20 may be adjusted based on the ambient so that the image imaged by the imaging device 20 may be compatible with the ambient after the pictures displayed on the transparent display panel are imaged by the imaging device 20.

The above implementations are illustrative, rather than limiting the disclosure. Those ordinary skilled in the art may make various changes and modifications without departing from the spirit and scope thereof. Therefore, all the equivalents should be also fallen within the scope of the disclosure. The scope of the disclosure is solely defined by claims.

The invention claimed is:

1. A display device comprising:
a transparent display panel;
an imaging device disposed at a light-exiting side of the transparent display panel; and
a light adjusting cover disposed at a side of the transparent display panel opposite to the light-exiting side, the transparent display panel being disposed such that a distance between the transparent display panel and the imaging device is less than or equal to a focal length of the imaging device;
wherein the imaging device is configured to image a picture displayed on the transparent display panel at a side of the transparent display panel away from the imaging device; and
wherein the light adjusting cover is switchable between a light-transmitting state and a light-shaded state, and is capable of covering a viewing field of human eyes;
wherein the imaging device comprises a liquid lens, and the liquid lens comprises a transparent housing and a conductive aqueous solution and an insulation solution that are packaged in the transparent housing; a hydrophobic layer being provided on an inner wall of the transparent housing and incompletely covering the transparent housing;
wherein the conductive aqueous solution and the insulation solution have different refractive indexes and are not soluble in each other.

2. The display device according to claim 1, wherein the imaging device comprises a lens group.

3. The display device according to claim 1, wherein the light adjusting cover comprises a curved-surface type light adjusting cover.

4. The display device according to claim 1, wherein the light adjusting cover comprises a liquid crystal light adjusting cover configured to control the light adjusting cover to switch between the light-transmitting state and the light-shaded state by controlling deflection of liquid crystal molecules.

5. The display device according to claim 4, wherein the liquid crystal light adjusting cover comprises a first substrate, a second substrate, a liquid crystal layer disposed between the first substrate and the second substrate, an upper polarizer disposed on a side of the first substrate away from the liquid crystal layer, and a lower polarizer disposed on a side of the second substrate away from the liquid crystal layer,
wherein a polarization direction of the upper polarizer is perpendicular to that of the lower polarizer.

6. The display device according to claim 1, wherein the light adjusting cover comprises a movable shutter plate movable to block or transmit light to control whether the light adjusting cover is in the light-transmitting state or the light-shaded state.

7. The display device according to claim 1, wherein the transparent display panel comprises an organic light-emitting diode display panel.

8. The display device according to claim 1, further comprising a controller configured to control the light adjusting cover to be in the light-transmitting state or the light-shaded state and/or to control the focal length of the imaging device.

9. The display device according to claim 1, wherein the display device comprises wearable glasses or a wearable helmet.

10. A method for controlling the display device according to claim 1, the method comprising:
controlling the light adjusting cover to be in the light-shaded state and adjusting the focal length of the imaging device to perform a virtual reality display; or
controlling the light adjusting cover to be in the light-transmitting state while adjusting the focal length of the imaging device to obtain a bigger and farther image of the picture displayed on the transparent display panel and thus perform an augmented reality display.

11. The method according to claim 10, wherein adjusting the focal length of the imaging device to perform a virtual reality display comprises:

adjusting a focal length ($f_1$) of the imaging device so that $f_1 = L \times d \times \tan \alpha / [r + (d-L) \times \tan \alpha]$;

wherein $\alpha$ is an included angle between a line connecting a top of the image imaged during the virtual reality display and the human eyes and a primary optical axis of the imaging device, d is a distance between the imaging device and the human eyes, r is a distance between a top of the transparent display panel and the primary optical axis of the imaging device, and L is a distance between the transparent display panel and the imaging device.

12. The method according to claim 11, wherein adjusting the focal length ($f_1$) of the imaging device so that $f_1 = L \times d \times \tan \alpha / [r + (d-L) \times \tan \alpha]$ comprises:

adjusting the focal length $f_1$ of the imaging device so that $f_1 = L \times d \times \tan \beta / [r + (d-L) \times \tan \beta]$, wherein $\beta$ is an included angle between a line connecting a top of the image just covering the view field of the human eyes and the human eyes, and the primary optical axis of the imaging device.

13. The method according to claim 12, wherein adjusting the focal length of the imaging device to perform the augmented reality display comprises adjusting a focal length ($f_2$) of the imaging device so that $f_2 = L \times d \times \tan \gamma / [r + (d-L) \times \tan \gamma]$, wherein $\gamma$ is an included angle between a line connecting a top of the image imaged during the augmented reality display and the human eyes and the primary optical axis of the imaging device, and $\gamma < \beta$.

14. The display device according to claim 1, wherein a first electrode is provided on an inner wall of the transparent housing, a second electrode is provided in contact with the conductive aqueous solution on a bottom surface of the transparent housing, and an insulation layer is disposed between the first electrode and the hydrophobic layer such that the conductive aqueous solution, the first electrode and the insulation layer constitute a capacitor such that a radian of interface between the conductive aqueous solution and the insulation solution is changed when a voltage is applied between the conductive aqueous solution and the first electrode, which results in change of the focal length of the liquid lens.

* * * * *